(12) United States Patent
Tang (10) Patent No.: US 11,997,799 B2
(45) Date of Patent: May 28, 2024

(54) METHOD FOR MANUFACTURING PRINTED CIRCUIT BOARD

(71) Applicant: SHENNAN CIRCUITS CO., LTD., Shenzhen (CN)

(72) Inventor: Changsheng Tang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 58 days.

(21) Appl. No.: 17/565,473

(22) Filed: Dec. 30, 2021

(65) Prior Publication Data

US 2022/0256716 A1 Aug. 11, 2022

Related U.S. Application Data

(63) Continuation of application No. PCT/CN2021/119659, filed on Sep. 22, 2021.

(30) Foreign Application Priority Data

Feb. 5, 2021 (CN) .......................... 202110164506.6

(51) Int. Cl.
*H05K 3/40* (2006.01)
*H05K 1/11* (2006.01)
(Continued)

(52) U.S. Cl.
CPC ........... *H05K 3/4007* (2013.01); *H05K 1/111* (2013.01); *H05K 3/188* (2013.01); *H05K 3/26* (2013.01); *H05K 3/424* (2013.01)

(58) Field of Classification Search
CPC ........ H05K 3/4007; H05K 3/188; H05K 3/26; H05K 3/424; H05K 3/06; H05K 3/427;
(Continued)

(56) References Cited

U.S. PATENT DOCUMENTS

| 6,440,542 B1 * | 8/2002 | Kariya ................. H05K 3/0035 |
| | | 174/262 |
| 7,172,925 B2 * | 2/2007 | Murakami ............. H05K 3/281 |
| | | 174/255 |

(Continued)

FOREIGN PATENT DOCUMENTS

| CN | 1709015 A | 12/2005 |
| CN | 1709016 A | 12/2005 |

(Continued)

OTHER PUBLICATIONS

Chinese First Office Action, Chinese Application No. 202110164506.6 mailed Mar. 8, 2023 (14 pages).

(Continued)

*Primary Examiner* — Donghai D Nguyen (57) ABSTRACT

The present application provides a method for manufacturing a printed circuit board and a printed circuit board. The method for manufacturing a printed circuit board includes: providing a core board, wherein the core board includes an insulating baseplate, and a first surface and/or a second surface opposite to the first surface of the insulating baseplate is provided with a plurality of pads; and laminating a medium layer on a side of the insulating baseplate provided with the plurality of pads to form a laminated layer at least partially embedded among the plurality of pads.

18 Claims, 5 Drawing Sheets

---

A medium layer is laminated on a side of the insulating baseplate provided with the plurality of pads to form a laminated layer partially embedded among the plurality of pads and partially covering the plurality of pads — S121

↓

The laminated layer is processed to expose the pads — S122

(51) Int. Cl.
*H05K 3/18* (2006.01)
*H05K 3/26* (2006.01)
*H05K 3/42* (2006.01)

(58) Field of Classification Search
CPC ... H05K 1/111; H05K 1/113; Y10T 29/49165; H01L 23/3121
See application file for complete search history.

(56) References Cited

U.S. PATENT DOCUMENTS

| | | | | |
|---|---|---|---|---|
| 7,243,425 | B2 * | 7/2007 | Hirata | H05K 3/0008 |
| | | | | 29/830 |
| 7,716,825 | B2 * | 5/2010 | Murakami | H05K 3/28 |
| | | | | 29/830 |
| 8,416,576 | B2 * | 4/2013 | Chu | H01L 23/3121 |
| | | | | 174/262 |
| 9,788,439 | B2 * | 10/2017 | Takano | H05K 3/06 |
| 2006/0115582 | A1 | 6/2006 | Murakami et al. | |

FOREIGN PATENT DOCUMENTS

| | | |
|---|---|---|
| CN | 101296570 A | 10/2008 |
| CN | 104703390 A | 6/2015 |
| CN | 107624002 A | 1/2018 |
| CN | 107770959 A | 3/2018 |
| CN | 110784992 A | 2/2020 |
| CN | 111642081 A | 9/2020 |

OTHER PUBLICATIONS

International Search Report, International application No. PCT/CN2021/119659, mailed Dec. 22, 2021 (9 pages).
Chinese second Office Action, Chinese Application No. 2021101645066, mailed Jun. 22, 2023 (15 pages).
Chinese Rejection decision, Application No. 2021101645066, mailed Aug. 23, 2023 (13 pages).

* cited by examiner

| An anti-etching film is provided on the first surface and/or the second surface of the substrate board, wherein the anti-etching film exposes the plurality of second preset positions on the first metal layer and/or the plurality of third preset positions on the second metal layer | S311 |

↓

| The plurality of second preset positions of the first metal layer are etched to expose the insulating baseplate and form the plurality of pads, and/or the plurality of third preset positions of the second metal layer are etched to expose the insulating baseplate and form the plurality of pads | S312 |

↓

| The anti-etching film is removed | S313 |

| A medium layer is laminated on a side of the insulating baseplate provided with the plurality of pads to form a laminated layer partially embedded among the plurality of pads and partially covering the plurality of pads | S121 |
|---|---|
| The laminated layer is processed to expose the pads | S122 |

METHOD FOR MANUFACTURING PRINTED CIRCUIT BOARD

CROSS-REFERENCE TO RELATED APPLICATIONS

The present application is a continuation-application of International (PCT) Patent Application No. PCT/CN2021/119659 filed on Sep. 22, 2021, which claims priority of a Chinese patent application submitted to State Intellectual Property Office of China on Feb. 5, 2021, with an application No. 202110164506.6; the entire content thereof is incorporated herein by reference.

TECHNICAL FIELD

The present application relates to the technical field of machining and manufacturing circuit boards, and in particular to a method for manufacturing a printed circuit board and a printed circuit board.

BACKGROUND

In production processes of circuit boards, it is often required to provide a laminated layer on a surface of a circuit board to protect a circuit layer on the circuit board and avoid short circuits between pads when mounting electronic components.

At present, laminated layers are generally formed by silk-screen printing solder mask ink or coating with plastic encapsulant material on circuit boards; however, in laminated layers formed by the above-mentioned methods, not only are the laminated layers prone to fall off and not conducive to high-density wiring layout, but also the laminated layers are thicker and not conducive to miniaturization design of products; at the same time, silk-screen printed solder mask ink may cause side corrosion problems.

SUMMARY OF THE DISCLOSURE

The present application provides a method for manufacturing a printed circuit board and a printed circuit board, the method for manufacturing a printed circuit board can realize lighter and thinner laminated layers and are not prone to cause side corrosion problems.

In order to solve the above technical problems, one technical solution adopted by the preset application is to provide a method for manufacturing a printed circuit board. The method for manufacturing a printed circuit board includes: providing a core board, wherein the core board includes an insulating baseplate, and a first surface and/or a second surface opposite to the first surface of the insulating baseplate is provided with a plurality of pads; and laminating a medium layer on a side of the insulating baseplate provided with the plurality of pads to form a laminated layer at least partially embedded among the plurality of pads.

Among them, the laminating a medium layer on a side of the insulating baseplate provided with the plurality of pads to form a laminated layer at least partially embedded among the plurality of pads includes: laminating a medium layer on a side of the insulating baseplate provided with the plurality of pads to form a laminated layer partially embedded among the plurality of pads and partially covering the plurality of pads; and processing the laminated layer to expose the pads.

Among them, the processing the laminated layer to expose the pads includes: polishing a surface of a side of the laminated layer distancing from the insulating baseplate to expose the pads.

Among them, both the first surface and the second surface of the insulating baseplate are provided with the pads; and the operation of laminating a medium layer on a side of the insulating baseplate provided with the plurality of pads specifically includes: respectively laminating a first medium layer and a second medium layer on the first surface and the second surface of the insulating baseplate to form a first laminated layer and a second laminated layer; and the processing the laminated layer to expose the pads includes: polishing a surface of a side of the first laminated layer and/or the second laminated layer distancing from the insulating baseplate to expose the pads on the first surface of the insulating baseplate and/or expose the pads on the second surface of the insulating baseplate.

Among them, the operation of providing a core board specifically includes: providing a substrate board, wherein the substrate board includes the insulating baseplate, a first metal layer provided on a first surface of the substrate board, and a second metal layer provided on a second surface of the substrate board opposite to the first surface; providing holes at a plurality of first preset positions on the substrate board, wherein the holes penetrating from a surface of a side of the first metal layer distancing from the insulating baseplate to a surface of a side of the second metal layer closing to the insulating baseplate; electroplating on the positions of the holes to form conductive pillars, wherein the conductive pillars are connected with the first metal layer and the second metal layer; and etching a plurality of second preset positions on the first metal layer and/or a plurality of third preset positions on the second metal layer to form the plurality of pads.

Among them, the operation of electroplating on the positions of the holes to form conductive pillars specifically includes: providing an anti-plating film on a surface of at least one side of the substrate board corresponding to openings of the holes, wherein the anti-plating film at least exposes out of the openings of the holes; electroplating a metal layer in the holes to form the conductive pillars; and removing the anti-plating film.

Among them, the operation of etching a plurality of second preset positions on the first metal layer and/or a plurality of third preset positions on the second metal layer to form the plurality of pads specifically includes: providing an anti-etching film on the first surface and/or the second surface of the substrate board, wherein the anti-etching film exposes the plurality of second preset positions on the first metal layer and/or the plurality of third preset positions on the second metal layer; etching the plurality of second preset positions of the first metal layer to expose the insulating baseplate and form the plurality of pads, and/or etching the plurality of third preset positions of the second metal layer to expose the insulating baseplate and form the plurality of pads; and removing the anti-etching film.

Among them, a surface of a side of the pad distancing from the insulating baseplate is higher than a surface of a side of the first metal layer distancing from the insulating baseplate.

Among them, the material of the medium layer is one or more of epoxy resin, phenolic resin, polyimide, BT resin, ABF resin and ceramic base.

In order to solve the above technical problems, another technical solution adopted by the present application is to provide a printed circuit board. The printed circuit board includes an insulating baseplate, a plurality of pads, and at least one laminated layer; wherein the plurality of pads are provided on a first surface and/or a second surface arranged to be opposite to the first surface of the insulating baseplate, and are configured to mount electronic components; and at least a part of the laminated layer is embedded among the plurality of pads to insulate two adjacent ones of the pads.

Among them, the printed circuit board further includes a wiring layer provided on the first surface and/or the second surface of the insulating substrate; the pads are higher than the wiring layer and/or the pads are flush with the wiring layer, and exposed surfaces of both the two are polished surfaces.

Among them, the plurality of pads are formed on the first surface and the second surface of the insulating baseplate, and the pads on the first surface and the pads on the second surface are connected in pairs; the number of the laminated layer is two, which are a first laminated layer and a second laminated layer; the first laminated layer and the second laminated layer are respectively provided on the first surface and the second surface of the insulating baseplate, and the first laminated layer and/or the second laminated layer has a part embedded among the plurality of pads and a part covering the plurality of pads.

Among them, the material of the laminated layer is one or more of epoxy resin, phenolic resin, polyimide, BT resin, ABF resin and ceramic base.

In order to solve the above technical problems, another technical solution adopted by the present application is to provide a printed circuit board. The printed circuit board includes: an insulating baseplate; a plurality of pads provided on the insulating baseplate; a wiring layer provided on the insulating baseplate and connected with the plurality of pads; and at least one laminated layer, wherein a part of the laminated layer is embedded among the plurality of pads to insulate adjacent ones of the pads from each other, and a part of the laminated layer covers the wiring layer.

Among them, the plurality of pads are flush with the laminated layer.

Among them, the insulating baseplate has a first surface and a second surface opposite to the first surface, the plurality of pads are provided on both the first surface and the second surface; and the at least one laminated layer comprises a first laminated layer provided on the first surface and a second laminated layer provided on the second surface.

Among them, the pads provided on the first surface are flush with the first laminated layer, and the pads provided on the second surface are flush with the second laminated layer.

Among them, the printed circuit board further includes current conduction pillars formed in the insulating baseplate, wherein the current conduction pillars penetrate from the first surface to the second surface to electrically connect the pads on the first surface with the pads on the second surface.

Among them, the plurality of pads are higher than the wiring layer or flush with the wiring layer.

Among them, some of the plurality of pads are higher than the wiring layer and the other of the plurality of pads are flush with the wiring layer.

The present application provides a method for manufacturing a printed circuit board and a printed circuit board. In the method for manufacturing a printed circuit board, a core board is provided, wherein the core board includes an insulating baseplate, and a first surface and/or a second surface opposite to the first surface of the insulating baseplate is provided with a plurality of pads; and a medium layer is laminated on a side of the insulating baseplate provided with the plurality of pads to form a laminated layer at least partially embedded among the plurality of pads. Among them, since the laminated layer is directly embedded among the pads by means of lamination, compared with laminated layers formed by silk-screen printing ink or coating with plastic encapsulant material, not only can the core board be protected, but also probability of the problem that the laminated layer falls out can be greatly reduced, so that probability of the problem that short circuit occurs among the pads when mounting electronic components is effectively reduced. At the same time, a thickness of the laminated layer can be controlled within a certain range, the thickness of the laminated layer is effectively reduced, thereby facilitating miniaturization design of products; in addition, the problem of side corrosion can be avoided.

DETAILED DESCRIPTION

Technical solutions in embodiments of the present application will be clearly and completely described below in combination with the drawings in the embodiments of the present application. Obviously, the described embodiments are only some embodiments of the present application, rather than all embodiments. Based on the embodiments in the present application, all other embodiments obtained by one of ordinary skill in the art without creative work shall fall within the protection scope of the present application.

Terms "first", "second", and "third" in the present application are only used for descriptive purposes, and cannot be understood as indicating or implying relative importance or implicitly indicating the number of indicated technical features. Thus, features defined with "first", "second", and "third" may explicitly or implicitly include at least one of such features. In the description of the present application, "a plurality of" means at least two, such as two, three, etc., unless otherwise clearly and specifically defined. All directional indications (such as up, down, left, right, front, back) in the embodiments of the present application are only used to explain relative position relationships, movement statuses, and so on among components in a certain specific posture (as shown in the drawings), if the specific posture changes, the directional indication will also change accordingly. In addition, terms "include", "having" and any variations thereof are intended to cover non-exclusive inclusions. For example, a process, method, system, product, or device that includes a series of steps or units is not limited to listed steps or units, but optionally further includes unlisted steps or units, or optionally further includes other steps or units inherent for these processes, methods, products or devices.

Mentioning "embodiments" herein means that a specific feature, structure, or characteristic described in combination with the embodiments may be included in at least one embodiment of the present application. The appearance of the phrase in various places in the specification does not necessarily refer to the same embodiment, nor is it an independent or alternative embodiment mutually exclusive with other embodiments. Those skilled in the art can clearly and implicitly understand that the embodiments described herein can be combined with other embodiments.

The present application is described in detail below with reference to the drawings and embodiments.

Figure 1:
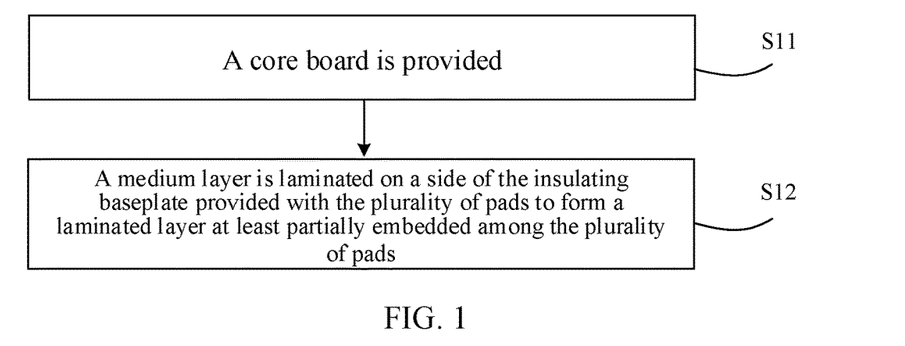
FIG. 1 is a flow chart of a method for manufacturing a printed circuit board provided by an embodiment of the present application.

Referring to FIG. 1, FIG. 1 is a flow chart of a method for manufacturing a printed circuit board provided by an embodiment of the present application. In this embodiment, a method for manufacturing a printed circuit board is provided, the method includes the follows.

An operation S11: a core board is provided.

Figure 2:
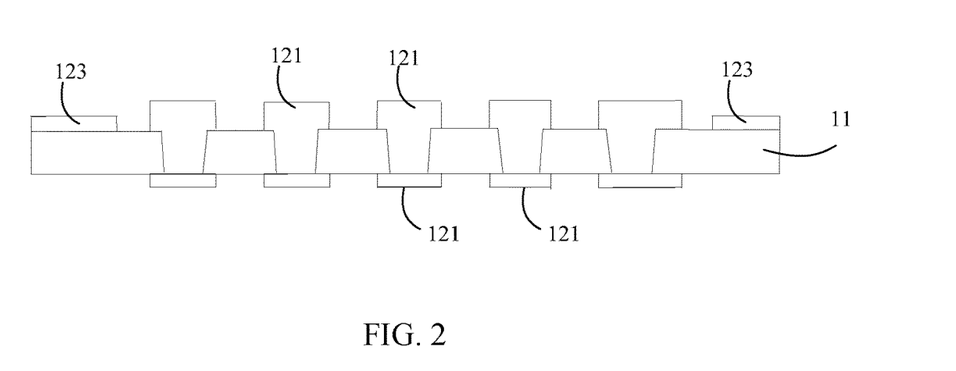
FIG. 2 shows a structural schematic view of a core board provided by an embodiment of the present application.

Among them, a specific structure of the core board can refer to FIG. 2, FIG. 2 shows a structural schematic view of a core board provided by an embodiment of the present application. The core board includes an insulating baseplate 11, a plurality of wiring layers 123, and a plurality of pads 121. The insulating baseplate 11 includes a first surface and a second surface opposite to the first surface, and the insulating baseplate 11 defines a plurality of holes 111 extending from the first surface to the second surface. The plurality of wiring layers 123 are spaced apart from each other and located on the first surface of the insulating baseplate 11. The plurality of pads 121 are located on the first surface and the second surface of the insulating baseplate 11. The plurality of pads 121 are spaced apart from the plurality of wiring layers 123. Each of the plurality of pads 121 located on the first surface of the insulating baseplate 11 is located in a corresponding one of the plurality of holes 111. A distance between a surface of each of the plurality of pads 121 located in the plurality of holes 111 away from the insulating baseplate 11 and the first surface of the insulating baseplate 11 is greater than a distance between a surface of each of the plurality of wiring layers 123 away from the insulating baseplate 11 and the first surface of the insulating baseplate 11.

Figure 3:
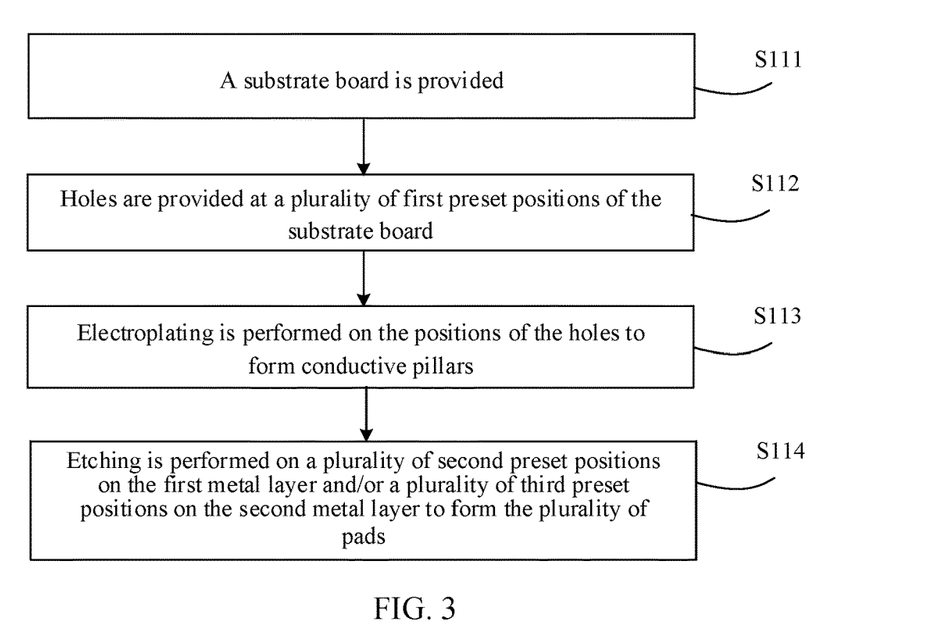
FIG. 3 is a sub-flow chart of an operation S11 in FIG. 1 provided by an embodiment of the present application.

Specifically, referring to FIG. 3, FIG. 3 is a sub-flow chart of the operation S11 in FIG. 1 provided by an embodiment of the present application. The operation S11 can specifically include the follows.

Operation S111: a substrate board is provided.

Figure 4:
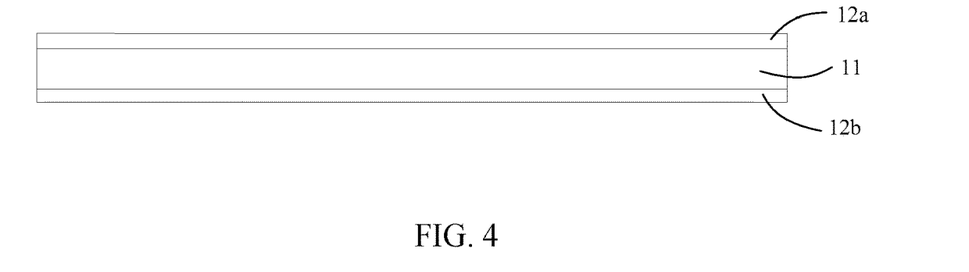
FIG. 4 is a structural schematic view of a substrate board provided by an embodiment of the present application.

Among them, the substrate board includes an insulating baseplate 11 and at least one metal layer; wherein the insulating baseplate 11 can be semi-immobilized, and the metal layer can be a copper layer. In a specific embodiment, referring to FIG. 4, FIG. 4 is a structural schematic view of a substrate board provided by an embodiment of the present application. The substrate board includes an insulating baseplate 11 and two metal layers, which are respectively aa first metal layer 12a and a second metal layer 12b; wherein the first metal layer 12a can be provided on a first surface of the insulating baseplate 11, and the second metal layer 12b can be provided on a second surface of the insulating baseplate 11 opposite to the first surface.

Operation S112: holes are provided at a plurality of first preset positions of the substrate board.

Figure 5:
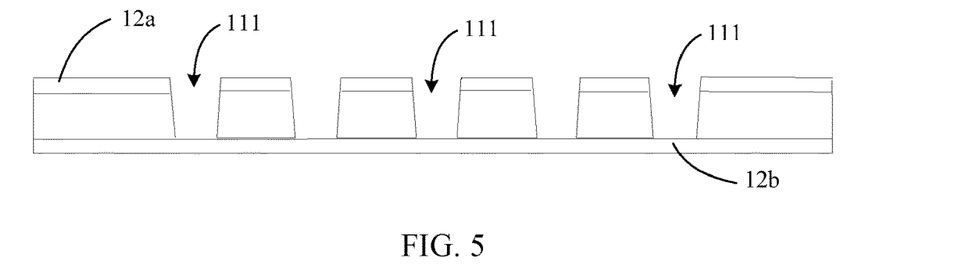
FIG. 5 is a structural schematic view of a product in FIG. 3 after being processed by an operation S112 provided by an embodiment of the present application.

Specifically, it is possible to form holes 111 in a plurality of first preset positions of the substrate board by means of laser drilling or milling by a milling machine, and the first preset positions can be selected according to actual requirements of a wiring layer 123. Among them, referring to FIG. 5, FIG. 5 is a structural schematic view of a product in FIG. 3 after being processed by the operation S112 provided by an embodiment of the present application. A longitudinal cross-section of the hole 111 can be shaped as inverted taper to facilitate later electroplating of the metal layer in the hole 111, and the hole 111 can specifically penetrate from a surface of a side of the first metal layer 12a distancing from the insulating baseplate 11 to a surface of a side of the second metal layer 12b close to the insulating baseplate 11, which is taken as an example in the following embodiments.

Operation S113: electroplating is performed on the positions of the holes to form conductive pillars.

Figure 6:
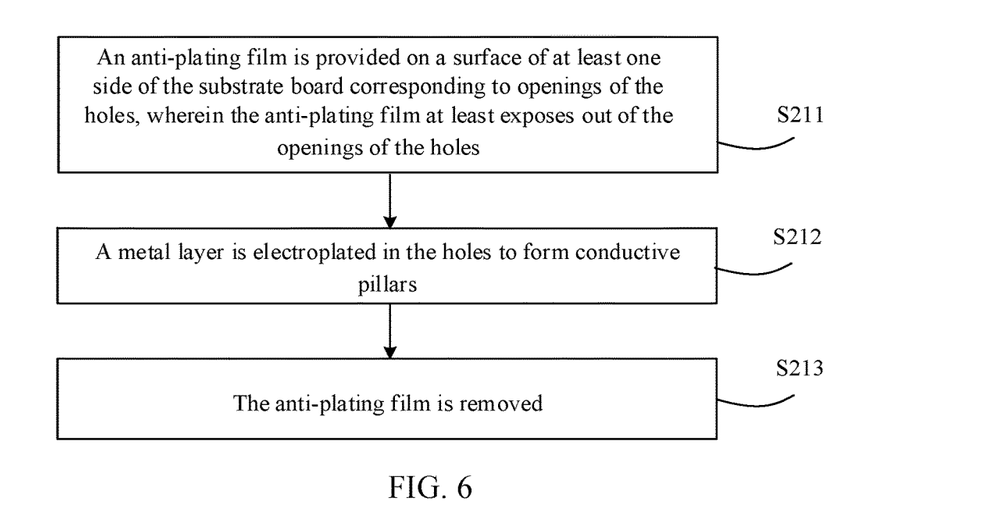
FIG. 6 is a sub-flow chart of an operation S113 in FIG. 3 provided by an embodiment of the present application.

Specifically, referring to FIG. 6, FIG. 6 is a sub-flow chart of the operation S113 in FIG. 3 provided by an embodiment of the present application. The operation S1132 specifically includes the follows.

Operation 211: an anti-plating film is provided on a surface of at least one side of the substrate board corresponding to openings of the holes, wherein the anti-plating film at least exposes out of the openings of the holes.

Figure 7:
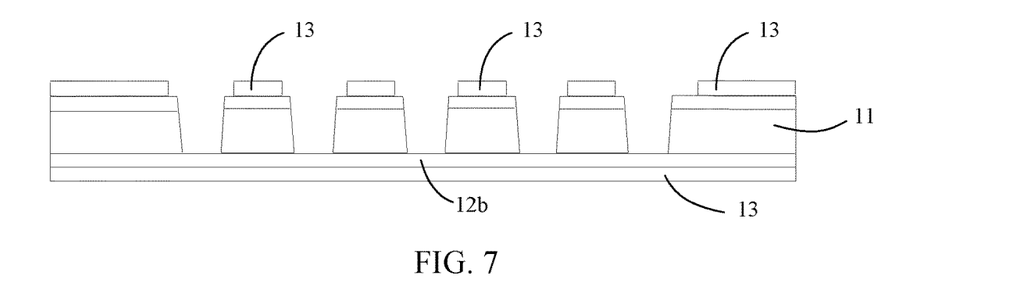
FIG. 7 is a structural schematic view of a product in FIG. 6 after being processed by an operation S211 provided by an embodiment of the present application.

Specifically, a photosensitive anti-plating film 13 can be provided on both the first surface and the second surface opposite to the first surface of the core board, so that a polymerization reaction (a reaction process of synthesizing from monomers to polymer) can occur after being irradiated by a specific light source to form a stable substance attached to a surface of the core board, thereby achieving a function of blocking electroplating; specifically, the first surface of the core board is in the same direction as the first surface of the insulating baseplate 11. Specifically, a structure of a product after being processed by the operation S211 can refer to FIG. 7, FIG. 7 is a structural schematic view of a product in FIG. 6 after being processed by the operation S211 provided by an embodiment of the present application.

Operation S212: a metal layer is electroplated in the holes to form conductive pillars.

Figure 8:
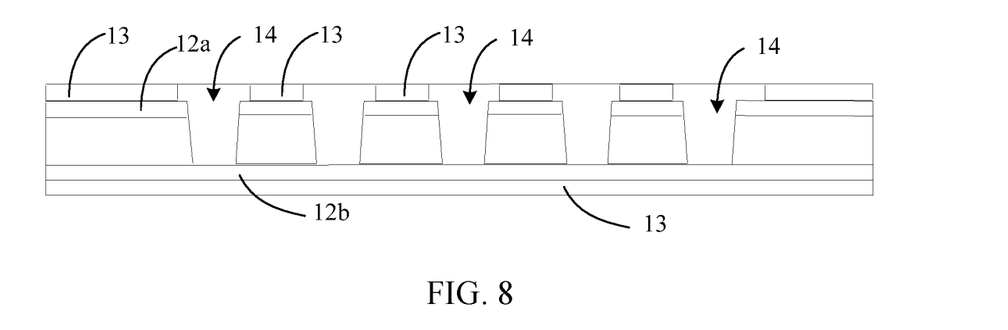
FIG. 8 is a structural schematic view of a product in FIG. 6 after being processed by an operation S212 provided by an embodiment of the present application.

Specifically, a structure of a product after being processed by the operation S212 can specifically refer to FIG. 8, FIG. 8 is a structural schematic view of a product in FIG. 6 after being processed by the operation S212 provided by an embodiment of the present application. Specifically, conductive pillars 114 can be formed in holes 111 by electroplating filling or copper immersion treatment, the conductive pillars 14 can specifically be connected with the first metal layer 12a ad the second metal layer 12b, and each conductive pillar 14 can specifically include a current conduction pillar and a boss. Among them, the current conduction pillar is formed in the insulating baseplate 11, and the boss is formed on the first surface of the insulating baseplate 11. In a specific embodiment, a surface of a side of the conductive pillar 14 distancing from the second metal layer 12b, that is, a surface of a side of the boss distancing from the insulating baseplate 11, is flush with a surface of a side of the anti-plating film 13 distancing from the substrate board, such that the surface of the side of the boss distancing from the insulating baseplate 11, which is formed in later, is higher than a surface of a side of the metal layer distancing from the insulating baseplate 11, and thus after the medium layer is laminated in later and polishing processing is performed, not only can a surface of the boss be exposed for performing welding, but also positions that need not to be welded (i.e., the wiring layer 123 on the insulating baseplate) can be protected by the medium layer; the following embodiments take this as an example. Of course, in other embodiments, a surface of a side of the conductive pillar 14 distancing from the second metal layer 12b, that is, a surface of a side of the boss distancing from the insulating baseplate 11, can also be flush with a surface of a side of the first metal layer 12a distancing from the insulating baseplate 11, in other words, a surface of the boss is flush with a surface of the first metal layer 12a.

Operation S213: the anti-plating film is removed.

Figure 9:
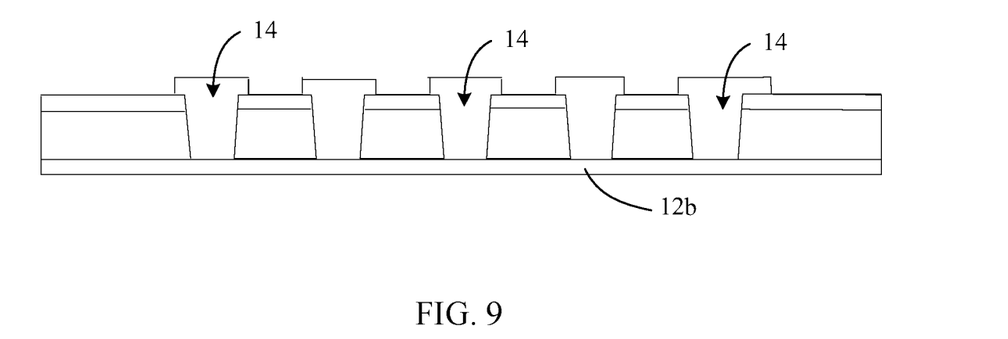
FIG. 9 is a structural schematic view of a product in FIG. 6 after being processed by an operation S213 provided by an embodiment of the present application.

Specifically, a structure of a product after being processed by the operation S213 can specifically refer to FIG. 9, FIG. 9 is a structural schematic view of a product in FIG. 6 after being processed by the operation S213 provided by an embodiment of the present application.

Operation S114: etching is performed on a plurality of second preset positions on the first metal layer and/or a plurality of third preset positions on the second metal layer to form the plurality of pads.

Figure 10:
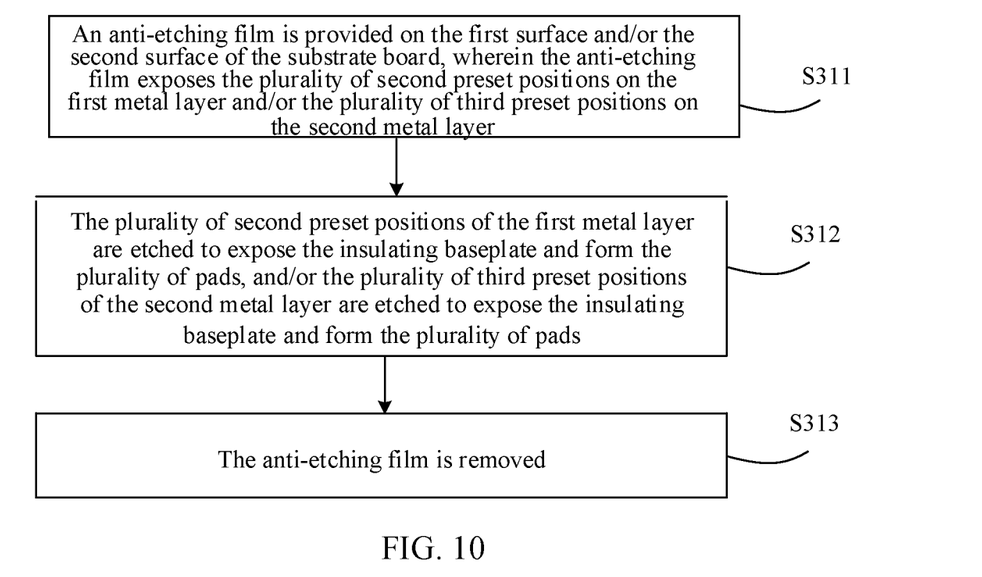
FIG. 10 is a sub-flow chart of an operation S114 in FIG. 3 provided by an embodiment of the present application.

Specifically, referring to FIG. 10, FIG. 10 is a sub-flow chart of the operation S114 in FIG. 3 provided by an embodiment of the present application. The operation S114 specifically includes the follows.

Operation S311: an anti-etching film is provided on the first surface and/or the second surface of the substrate board, wherein the anti-etching film exposes the plurality of second preset positions on the first metal layer and/or the plurality of third preset positions on the second metal layer.

Figure 11:
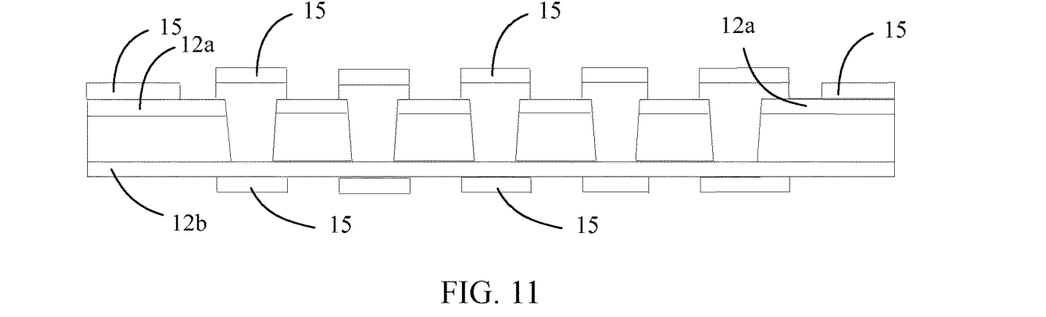
FIG. 11 is a structural schematic view of a product in FIG. 10 after being processed by an operation S311 provided by an embodiment of the present application.

Specifically, a light-sensing anti-etching film 15 can be provided on both the first surface and the second surface of the substrate board, so that a polymerization reaction (a reaction process of synthesizing from monomers to polymer) can occur after being irradiated by a specific light source and a stable substance is formed and attaches on a board surface, thereby achieving the function of blocking etching. Among them, the second preset positions and the third preset positions can be determined according to actual required positions of pads 121. Specifically, a structure of a product after being processed by the operation S311 can specifically refer to FIG. 11, FIG. 11 is a structural schematic view of a product in FIG. 10 after being processed by the operation S311 provided by an embodiment of the present application.

Operation S312: the plurality of second preset positions of the first metal layer are etched to expose the insulating baseplate and form the plurality of pads, and/or the plurality of third preset positions of the second metal layer are etched to expose the insulating baseplate and form the plurality of pads.

In a specific embodiment, it is possible to perform etching on the plurality of second preset positions on the first metal layer 12a and the plurality of third preset positions on the second metal layer 12b according to a preset wiring layer pattern, such that parts of the insulating baseplate 11 corresponding to the plurality of second preset positions and the plurality of third preset positions are exposed, thereby forming the wiring layer 123 on the surface of the insulating baseplate 11 and defining the plurality of pads 121; it can be understood that the pads 121 are just the aforesaid bosses. It can be understood that when a surface of a side of the conductive pillar 14 formed as above distancing from a surface of a side of the second metal layer 12b is flush with a surface of a side of the anti-plating film 13 distancing from the substrate board, regarding the pad 121 formed by this operation, a surface of a side thereof distancing from the insulating baseplate 11 is higher than a surface of a side of the first metal layer 12a distancing from the insulating baseplate 11 so as to form the pad 121; this facilitates leading the wiring layer 123 out of a surface of the medium layer by the protruding pad 121 after the medium layer is laminated in later; when a surface of a side of the conductive pillar 14 distancing from the second metal layer 12b is flush with a surface of a side of the first metal layer 12a distancing from the insulating baseplate 11, the surface of the side of the pad 121 distancing from the insulating baseplate 11 is flush with the surface of the side of the first metal layer 12a distancing from the insulating baseplate 11.

Figure 12:
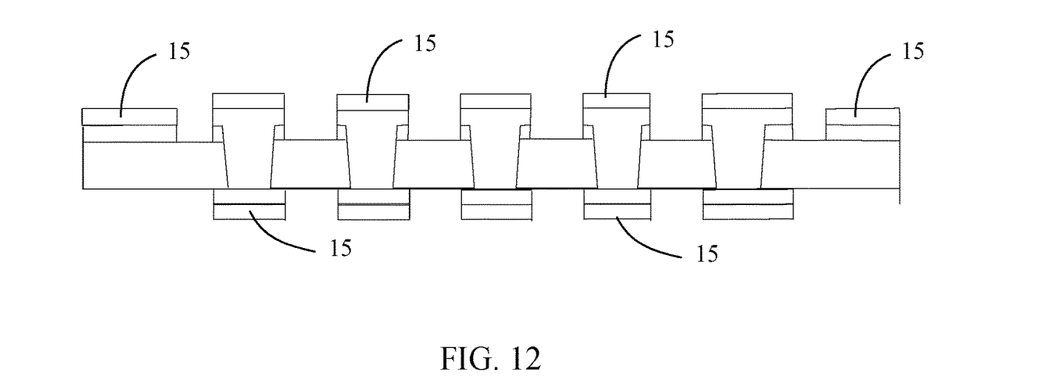
FIG. 12 is a structural schematic view of a product in FIG. 10 after being processed by an operation S312 provided by an embodiment of the present application.

In a specific embodiment, a lateral size of the pad 121 is larger than the maximum size of a cross-section of the hole 111. Specifically, a structure of a product after being processed by the operation 312 can specifically refer to FIG. 12, FIG. 12 is a structural schematic view of a product in FIG. 10 after being processed by the operation S312 provided by an embodiment of the present application.

Operation S313: the anti-etching film is removed.

Specifically, a structure of a product after being processed by the operation 313 can specifically refer to FIG. 2.

Operation S12: a medium layer is laminated on a side of the insulating baseplate provided with the plurality of pads to form a laminated layer at least partially embedded among the plurality of pads.

Figure 13:
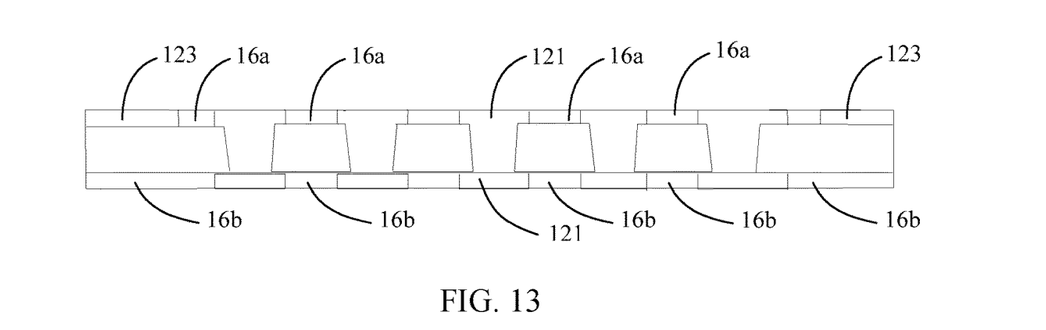
FIG. 13 is a structural schematic view of a product in FIG. 1 after being processed by an operation S12 provided by an embodiment of the present application.

In a specific embodiment, referring to FIG. 13, FIG. 13 is a structural schematic view of a product in FIG. 1 after being processed by the operation S12 provided by an embodiment of the present application. After the medium layer is laminated, the medium layer can be only embedded between two adjacent pads 121 to form the laminated layer, that is, the medium layer is only located between two adjacent pads 121.

Figure 14:
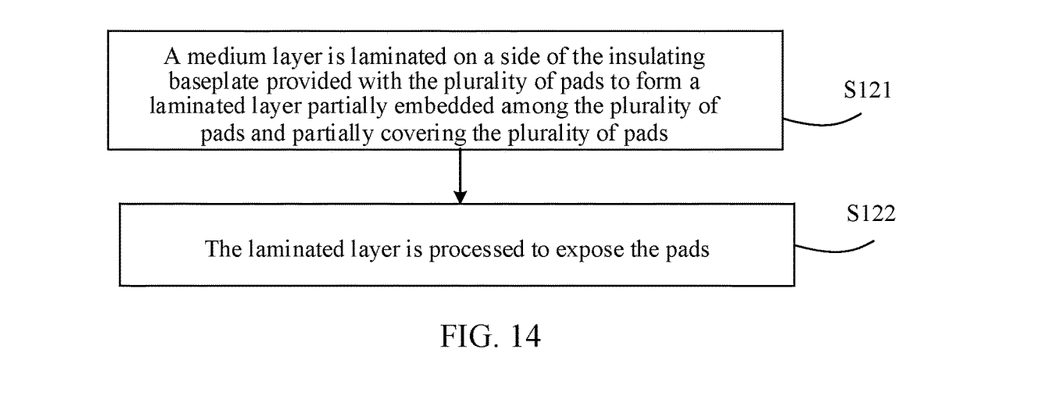
FIG. 14 is a sub-flow chart of an operation S12 provided by an embodiment of the present application.

In another specific embodiment, referring to FIG. 14, FIG. 14 is a sub-flow chart of the operation S12 provided by an embodiment of the present application. The operation S12 specifically includes the follows.

Operation S121: a medium layer is laminated on a side of the insulating baseplate provided with the plurality of pads to form a laminated layer partially embedded among the plurality of pads and partially covering the plurality of pads.

Figure 15:
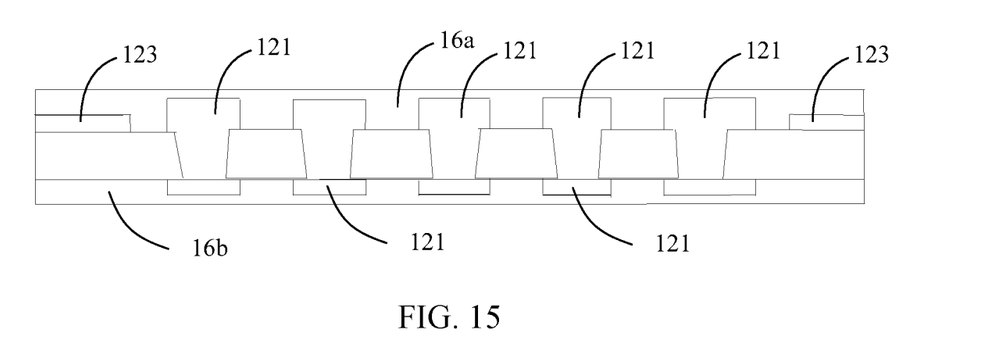
FIG. 15 is a structural schematic view of a product in FIG. 14 after being processed by an operation S121 provided by an embodiment of the present application.

In a specific embodiment, both the first surface and the second surface of the insulating baseplate 11 are provided with the pads 121, and the operation S121 specifically laminates a medium layer on each of the first surface and the second surface of the insulating baseplate 11. Specifically, it is possible to laminate a first medium layer on the first surface of the insulating baseplate 11 to form a first laminated layer 16a, and laminate a second medium layer on the second surface of the insulating baseplate 11 to form a second laminated layer 16b. Specifically, it is possible to dispose a medium layer on each of the first surface and the second surface of the insulating baseplate 11 and then place them into a pressing machine to laminate, thereby forming the first laminated layer 16a on the first surface of the insulating baseplate 11 and forming the second laminated layer 16b on the second surface of the insulating baseplate. Moreover, in a specific embodiment, a part of the medium layer is embedded among the plurality of pads 121 to perform insulation between two adjacent pads 121, and the remained part of the medium layer covers the plurality of pads 121 and the wiring layer 123. Specifically, a structure of a product after being processed by the operation S121 can specifically refer to FIG. 15, FIG. 15 is a structural schematic view of a product in FIG. 14 after being processed by the operation S121 provided by an embodiment of the present application.

Among them, material of the medium layer may specifically be one or more of epoxy resin, phenolic resin, polyimide, BT (Bismaleimide Triazine) resin, ABF (Ajinomoto Buildup Film, a kind of epoxy resin insulation film supplied by Japan Ajinomoto Co., Ltd.) resin and ceramic bases.

Operation S122: the laminated layer is processed to expose the pads.

In a specific embodiment, a surface of the medium layer has a layer of release film or copper foil; before the operation S122, the release film or copper foil on the surface is removed, and then a surface of a side of the laminated layer distancing from the insulating substrate 11 is polished to expose the pad 121. Specifically, the surface polishing treatment can be performed by means of leveling, brushing, laser ablation, ion cutting, ion polishing, water jetting, etc., until the polished pad 121 is distanced from a surface of a side of the insulating substrate 11.

Figure 16:
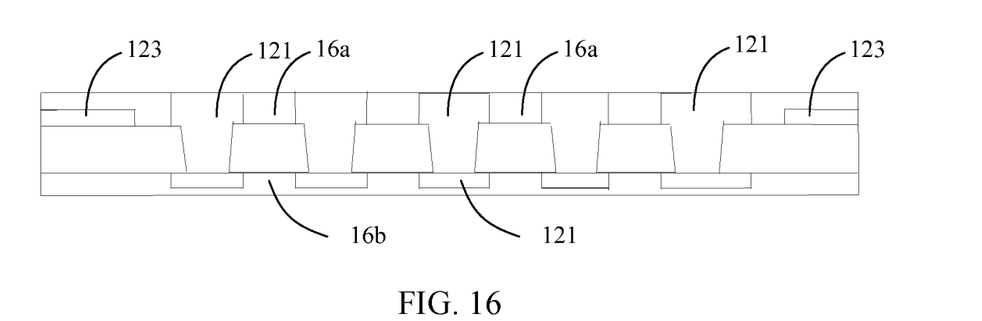
FIG. 16 is a structural schematic view of a product in FIG. 14 after being processed by an operation S122 provided by an embodiment of the present application.

Specifically, when the first laminated layer 16a and the second laminated layer 16b are respectively formed on the first surface and the second surface of the insulating baseplate 11, it is possible to only polish the laminated layer corresponding to the first surface requiring to mount electronic components to expose the pads 121 on this surface. The specific structure can refer to FIG. 16, FIG. 16 is a structural schematic view of a product in FIG. 14 after being processed by the operation S122 provided by an embodiment of the present application. Of course, in other embodiments, it is also possible to polish surfaces of sides of both the first laminated layer 16a and the second laminated layer 16b distancing from the insulating baseplate 11, such that the pads 121 on the first surface and the second surface of the insulating baseplate 11 are exposed, thereby facilitating mounting electronic components in later. Among them, the electronic components may specifically be resistors, inductors, diodes, etc.

Specifically, by performing oriented height control for the pads 121 at specified positions, the thickness of the laminated layer is made to be smaller, thereby facilitating development of miniaturization of the product; at the same time, the material of the insulating medium layer is laminated on the surface of the insulating substrate 11, and through a specific design, positions that need to be soldered is exposed for mounting electronic components, and positions that does not need to be soldered, that is, positions where electronic components do not need to be mounted, are protected by a medium layer. Thus, not only can assembly space be saved to achieve optimization of the assembly space, but also high-density graphics layout is also taken into account.

In the method for manufacturing a printed circuit board provided by this embodiment, a core board is provided, wherein the core board includes an insulating baseplate 11, and a first surface and/or a second surface opposite to the first surface of the insulating baseplate 11 is provided with a plurality of pads 121; and a medium layer is laminated on a side of the insulating baseplate 11 provided with the plurality of pads 121 to form a laminated layer at least partially embedded among the plurality of pads 121. Among them, since the laminated layer is directly embedded among the pads 121 by means of lamination, compared with laminated layers formed by silk-screen printing ink or coating with plastic encapsulant material, not only can the core board be protected, but also probability of the problem that the laminated layer falls out can be greatly reduced, so that probability of the problem that short circuit occurs among the pads 121 when mounting electronic components is effectively reduced. At the same time, a thickness of the laminated layer can be controlled within a certain range, the thickness of the laminated layer is effectively reduced, thereby facilitating miniaturization design of products; in addition, the problem of side corrosion can be avoided.

Figure 17:
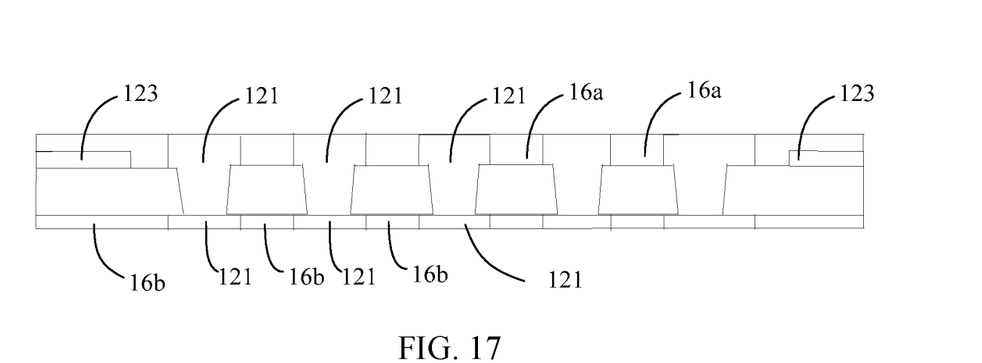
FIG. 17 is a structural schematic view of a printed circuit board provided by an embodiment of the present application.

Referring to FIG. 17, FIG. 17 is a structural schematic view of a printed circuit board provided by an embodiment of the present application. In this embodiment, a printed circuit board is provided, the printed circuit board can be specifically manufactured by the method for manufacturing a printed circuit board provided by the above embodiment; specifically, the printed circuit board can specifically include an insulating baseplate 11, a plurality of pads 121, and at least one laminated layer.

Among them, the insulating baseplate 11 can be a semi-immobilized piece; the plurality of pads 121 can be provided on a first surface and/or a second surface opposite to the first surface of the insulating baseplate 11 and configured to mount electronic components. In a specific embodiment, the plurality of pads 121 are provided on both the first surface and the second surface of the insulating baseplate 11, and current conduction pillars are formed on the insulating baseplate 11, the current conduction pillars penetrate the first surface and the second surface of the insulating baseplate to connect the pads 121 on the first surface and on the second surface. Among them, material of the pads 121 and the current conduction pillars can be metal, for example, can be copper. In a specific embodiment, a lateral size of the pad 121 is larger than a maximum area of a cross-section of the current conduction pillar. It can be understood that the pads 121 and the current conduction pillars in this embodiment cooperatively form the conductive pillars 14 involved in the above embodiment.

Among them, the printed circuit board can specifically include two laminated layers, which are respectively a first laminated layer 16a and a second laminated layer 16b; wherein the first laminated layer 16a can be provided on the first surface of the insulating baseplate 11 and the second laminated layer 16b can be provided on the second surface of the insulating baseplate 11. Among them, material of the first laminated layer 16a and the second laminated layer 16b may be one or more of epoxy resin, phenolic resin, polyimide, BT resin, ABF resin, and ceramic bases. Specifically, a thickness of each laminated layer can be 10-15 micrometers.

In a specific embodiment, the printed circuit board further includes a wiring layer 123 provided on the first surface and/or the second surface of the insulating baseplate 11, the pads 121 are connected with the wiring layer 123, and surfaces of sides of the pads 121 distancing from the insulating baseplate 11 can specifically be higher than a surface of a side of the wiring layer 123 distancing from the insulating baseplate 11, or the surfaces of the sides of the pads 121 distancing from the insulating baseplate 11 are flush with the surface of the side of the wiring layer 123 distancing from the insulating baseplate 11; of course, it is also possible that surfaces of sides of some pads 121 distancing from the insulating baseplate 11 are higher than the surface of the side of the wiring layer 123 distancing from the insulating baseplate 11, and surfaces of sides of the other pads 121 distancing from the insulating baseplate 11 are flush with the surface of the side of the wiring layer 123 distancing from the insulating baseplate 11, this embodiment does not limit herein, as long as it is possible to insulate the wiring layer 123 from the pads. Specifically, exposed surfaces of both the pads 121 and the wiring layer 123 are polished surfaces, that is, the surfaces of the sides of the pads 121 distancing from the insulating baseplate 11 and/or the surface of the side of the wiring layer 123 distancing from the insulating baseplate 11 are smooth surfaces after being polished.

In a specific embodiment, a part of the first laminated layer 16a and/or the second laminated layer 16b is embedded among the plurality of pads 121 and between the pads 121 and the wiring layer 123, so as to perform insulation between two adjacent pads 121 and between the pads 121 and the wiring layer 123 to prevent a short-circuit problem from occurring; the other part covers the surface of the side of the wiring layer 123 distancing from the insulating baseplate 11, so as to protect the wiring layer 123. In this way, positions that need to be soldered is exposed for mounting electronic components, and positions that does not need to be soldered, that is, positions where electronic components do not need to be mounted, are covered by a medium layer. Thus, not only can assembly space be saved to achieve optimization of the assembly space, but also high-density graphics layout is also taken into account.

In the printed circuit board provided by this embodiment, by providing the insulating baseplate 11 and the plurality of pads 121, the plurality of pads 121 are provided on the first surface and/or the second surface opposite to the first surface of the insulating baseplate 11, so as to mount electronic components through the pads 121; at the same time, by making at least a part of the laminated layer be embedded among the plurality of pads 121, adjacent pads 121 are insulated. Among them, since the laminated layer is directly embedded among the pads 121, compared with laminated layers formed by silk-screen printing ink or coating with plastic encapsulant material, not only can the insulation function be provided, but also probability of the problem that the laminated layer falls out can be greatly reduced, so that probability of the problem that short circuit occurs among the pads 121 when mounting electronic components is effectively reduced. At the same time, a thickness of the laminated layer is small, thereby facilitating miniaturization design of products; in addition, such product will not generate the problem of side corrosion.

The above are only embodiments of the present application, and do not limit the patent scope of the present application. Any equivalent structure or equivalent process transformation made using the content of the description and drawings of the present application, or direct or indirect application in other related technical fields, is similarly included in the patent protection scope of the present application.

What is claimed is:

1. A method for manufacturing a printed circuit board, comprising:
    providing a core board, wherein the core board comprises:
        an insulating baseplate comprising a first surface and a second surface opposite to the first surface, wherein the insulating baseplate defines a plurality of holes extending from the first surface to the second surface, and a longitudinal cross-section of each of the plurality of holes is shaped as inverted taper;
        a plurality of wiring layers spaced apart from each other and located on the first surface of the insulating baseplate; and
        a plurality of pads located on the first surface and the second surface of the insulating baseplate, wherein some of the plurality of pads are in direct contact with the first surface of the insulating baseplate, and some of the plurality of pads are in direct contact with the second surface of the insulating baseplate; the plurality of pads are spaced apart from the plurality of wiring layers; and each of the plurality of pads located on the first surface of the insulating baseplate is located in a corresponding one of the plurality of holes, and a distance between a surface of each of the plurality of pads located in the plurality of holes away from the insulating baseplate and the first surface of the insulating baseplate is greater than a distance between a surface of each of the plurality of wiring layers away from the insulating baseplate and the first surface of the insulating baseplate; and
    laminating a medium layer on a side of the insulating baseplate provided with the plurality of pads in a pressing machine to form a laminated layer at least partially embedded among the plurality of pads, wherein a material of the medium layer is one or more of polyimide, Bismaleimide Triazine (BT) resin, Ajinomoto Buildup Film (ABF) resin, and ceramic.

2. The method for manufacturing a printed circuit board according to claim 1, wherein the laminating a medium layer on a side of the insulating baseplate provided with the plurality of pads to form a laminated layer at least partially embedded among the plurality of pads comprises:
    laminating a medium layer on a side of the insulating baseplate provided with the plurality of pads to form a laminated layer partially embedded among the plurality of pads and partially covering the plurality of pads; and
    processing the laminated layer to expose the pads.

3. The method for manufacturing a printed circuit board according to claim 2, wherein the processing the laminated layer to expose the pads comprises:
    polishing a surface of a side of the laminated layer distancing from the insulating baseplate to expose the pads.

4. The method for manufacturing a printed circuit board according to claim 2, wherein both the first surface and the second surface of the insulating baseplate are provided with the pads; and the laminating a medium layer on a side of the insulating baseplate provided with the plurality of pads comprises:
    laminating a first medium layer on the first surface of the insulating baseplate to form a first laminated layer and laminating a second medium layer on the second surface of the insulating baseplate to form a second laminated layer; and the processing the laminated layer to expose the pads comprises:

polishing a surface of a side of the first laminated layer to expose the pads on the first surface of the insulating baseplate, and/or polishing a surface of a side of the second laminated layer distancing from the insulating baseplate to expose the pads on the second surface of the insulating baseplate.

5. The method for manufacturing a printed circuit board according to claim 1, wherein the providing a core board comprises:

providing a substrate board, wherein the substrate board includes the insulating baseplate, a first metal layer provided on a first surface of the substrate board, and a second metal layer provided on a second surface of the substrate board opposite to the first surface;

defining holes at a plurality of first preset positions on the substrate board, wherein the holes penetrate from a surface of a side of the first metal layer distancing from the insulating baseplate to a surface of a side of the second metal layer closing to the insulating baseplate;

electroplating on the positions of the holes to form conductive pillars, wherein the conductive pillars are connected with the first metal layer and the second metal layer; and etching a plurality of second preset positions on the first metal layer and/or a plurality of third preset positions on the second metal layer to form the plurality of pads.

6. The method for manufacturing a printed circuit board according to claim 5, wherein the electroplating on the positions of the holes to form conductive pillars comprises:

providing an anti-plating film on a surface of at least one side of the substrate board corresponding to openings of the holes, wherein the anti-plating film at least exposes out of the openings of the holes;

electroplating a metal layer in the holes to form the conductive pillars; and removing the anti-plating film.

7. The method for manufacturing a printed circuit board according to claim 5, wherein the etching a plurality of second preset positions on the first metal layer and/or a plurality of third preset positions on the second metal layer to form the plurality of pads comprises:

providing an anti-etching film on the first surface and/or the second surface of the substrate board, wherein the anti-etching film exposes the plurality of second preset positions on the first metal layer and/or the plurality of third preset positions on the second metal layer;

etching the plurality of second preset positions of the first metal layer to expose the insulating baseplate and form the plurality of pads, and/or etching the plurality of third preset positions of the second metal layer to expose the insulating baseplate and form the plurality of pads; and removing the anti-etching film.

8. The method for manufacturing a printed circuit board according to claim 1, wherein each of the plurality of pads located on the second surface of the insulating baseplate is free of a through hole and covers a corresponding one of the plurality of holes.

9. The method for manufacturing a printed circuit board according to claim 1, wherein a lateral size of each of the plurality of pads is greater than the maximum size of a cross-section of a corresponding one of the plurality of holes.

10. A method for manufacturing a printed circuit board, comprising:

providing a core board, wherein the core board comprises:

an insulating baseplate comprising a first surface and a second surface opposite to the first surface, wherein the insulating baseplate defines a plurality of holes extending from the first surface to the second surface;

a plurality of wiring layers spaced apart from each other and located on the first surface of the insulating baseplate; and a plurality of pads located on the first surface and the second surface of the insulating baseplate, wherein some of the plurality of pads are in direct contact with the first surface of the insulating baseplate, and some of the plurality of pads are in direct contact with the second surface of the insulating baseplate; the plurality of pads are spaced apart from the plurality of wiring layers; and each of the plurality of pads located on the first surface of the insulating baseplate is located in a corresponding one of the plurality of holes, and a distance between a surface of each of the plurality of pads located in the plurality of holes away from the insulating baseplate and the first surface of the insulating baseplate is greater than a distance between a surface of each of the plurality of wiring layers away from the insulating baseplate and the first surface of the insulating baseplate; and laminating a medium layer on a side of the insulating baseplate provided with the plurality of pads in a pressing machine to form a laminated layer at least partially embedded among the plurality of pads, wherein a material of the medium layer is one or more of polyimide, Bismaleimide Triazine (BT) resin, Ajinomoto Buildup Film (ABF) resin and ceramic.

11. The method for manufacturing a printed circuit board according to claim 10, wherein the laminating a medium layer on a side of the insulating baseplate provided with the plurality of pads to form a laminated layer at least partially embedded among the plurality of pads comprises:

laminating a medium layer on a side of the insulating baseplate provided with the plurality of pads to form a laminated layer partially embedded among the plurality of pads and partially covering the plurality of pads; and processing the laminated layer to expose the pads.

12. The method for manufacturing a printed circuit board according to claim 11, wherein the processing the laminated layer to expose the pads comprises:

polishing a surface of a side of the laminated layer distancing from the insulating baseplate to expose the pads.

13. The method for manufacturing a printed circuit board according to claim 11, wherein both the first surface and the second surface of the insulating baseplate are provided with the pads; and the laminating a medium layer on a side of the insulating baseplate provided with the plurality of pads comprises:

laminating a first medium layer on the first surface of the insulating baseplate to form a first laminated layer and laminating a second medium layer on the second surface of the insulating baseplate to form a second laminated layer; and the processing the laminated layer to expose the pads comprises:

polishing a surface of a side of the first laminated layer to expose the pads on the first surface of the insulating baseplate, and/or polishing a surface of a side of the second laminated layer distancing from the insulating baseplate to expose the pads on the second surface of the insulating baseplate.

14. The method for manufacturing a printed circuit board according to claim 10, wherein the providing a core board comprises:

providing a substrate board, wherein the substrate board includes the insulating baseplate, a first metal layer provided on a first surface of the substrate board, and a second metal layer provided on a second surface of the substrate board opposite to the first surface;

defining holes at a plurality of first preset positions on the substrate board, wherein the holes penetrate from a surface of a side of the first metal layer distancing from the insulating baseplate to a surface of a side of the second metal layer closing to the insulating baseplate;

electroplating on the positions of the holes to form conductive pillars, wherein the conductive pillars are connected with the first metal layer and the second metal layer; and etching a plurality of second preset positions on the first metal layer and/or a plurality of third preset positions on the second metal layer to form the plurality of pads.

15. The method for manufacturing a printed circuit board according to claim 14, wherein the electroplating on the positions of the holes to form conductive pillars comprises:

providing an anti-plating film on a surface of at least one side of the substrate board corresponding to openings of the holes, wherein the anti-plating film at least exposes out of the openings of the holes;

electroplating a metal layer in the holes to form the conductive pillars; and removing the anti-plating film.

16. The method for manufacturing a printed circuit board according to claim 14, wherein the etching a plurality of second preset positions on the first metal layer and/or a plurality of third preset positions on the second metal layer to form the plurality of pads comprises:

providing an anti-etching film on the first surface and/or the second surface of the substrate board, wherein the anti-etching film exposes the plurality of second preset positions on the first metal layer and/or the plurality of third preset positions on the second metal layer;

etching the plurality of second preset positions of the first metal layer to expose the insulating baseplate and form the plurality of pads, and/or etching the plurality of third preset positions of the second metal layer to expose the insulating baseplate and form the plurality of pads; and removing the anti-etching film.

17. The method for manufacturing a printed circuit board according to claim 10, wherein each of the plurality of pads located on the second surface of the insulating baseplate is free of a through hole and covers a corresponding one of the plurality of holes.

18. The method for manufacturing a printed circuit board according to claim 10, wherein a lateral size of each of the plurality of pads is greater than the maximum size of a cross-section of a corresponding one of the plurality of holes.

* * * * *